United States Patent
Eto

(10) Patent No.: US 7,630,268 B2
(45) Date of Patent: Dec. 8, 2009

(54) DYNAMIC SEMICONDUCTOR MEMORY REDUCING THE FREQUENCY OF OCCURRENCE OF REFRESH COMMAND REQUEST AND REFRESH CONTROL METHOD THEREOF

(75) Inventor: Satoshi Eto, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 205 days.

(21) Appl. No.: 11/450,472

(22) Filed: Jun. 12, 2006

(65) Prior Publication Data

US 2007/0230264 A1 Oct. 4, 2007

(30) Foreign Application Priority Data

Mar. 30, 2006 (JP) ............................. 2006-093827

(51) Int. Cl.
 *G11C 7/00* (2006.01)
(52) U.S. Cl. .................... 365/222; 365/230.03; 365/236
(58) Field of Classification Search ................. 365/222, 365/230.03, 236
 See application file for complete search history.

(56) References Cited

U.S. PATENT DOCUMENTS

| 4,106,108 | A | * | 8/1978 | Cislaghi et al. ............. 365/222 |
| 5,715,206 | A | | 2/1998 | Lee et al. |
| 6,104,658 | A | * | 8/2000 | Lu .............................. 365/222 |
| 6,134,169 | A | | 10/2000 | Tanaka |
| 6,625,077 | B2 | | 9/2003 | Chen |
| 6,731,560 | B2 | | 5/2004 | Yoon |
| 6,967,885 | B2 | * | 11/2005 | Barth et al. .................. 365/222 |
| 2003/0026161 | A1 | | 2/2003 | Yamaguchi et al. |
| 2004/0133735 | A1 | | 7/2004 | Sunaga et al. |
| 2005/0157577 | A1 | | 7/2005 | Barth, Jr. et al. |
| 2007/0291568 | A1 | * | 12/2007 | Yang et al. .................. 365/222 |

FOREIGN PATENT DOCUMENTS

| JP | 2000-163956 A | 6/2000 |
| JP | 2003-173676 A | 6/2003 |
| TW | 533413 | 5/2003 |
| TW | 569240 | 1/2004 |

OTHER PUBLICATIONS

Taiwanese Office Action dated Dec. 10, 2009 for a related Taiwanese application.

* cited by examiner

*Primary Examiner*—Huan Hoang
(74) *Attorney, Agent, or Firm*—Fujitsu Patent Center

(57) ABSTRACT

A dynamic semiconductor memory has a plurality of memory blocks and a memory core. Each of the memory blocks has a sense amplifier, and the memory core is formed from memory cells located at intersections between a plurality of word lines and a plurality of bit lines connected to the sense amplifier. The memory blocks are sequentially refreshed by selecting each of the word lines and by simultaneously activating the memory cells connected to the selected word line by the sense amplifier. The dynamic semiconductor memory has a first refresh counter which outputs a first internal refresh candidate address, and a second refresh counter which outputs a second internal refresh candidate address that is different from the first internal refresh candidate address. When an externally accessed address coincides with the first internal refresh candidate address, a refresh operation is performed starting from the second internal refresh candidate address.

45 Claims, 9 Drawing Sheets

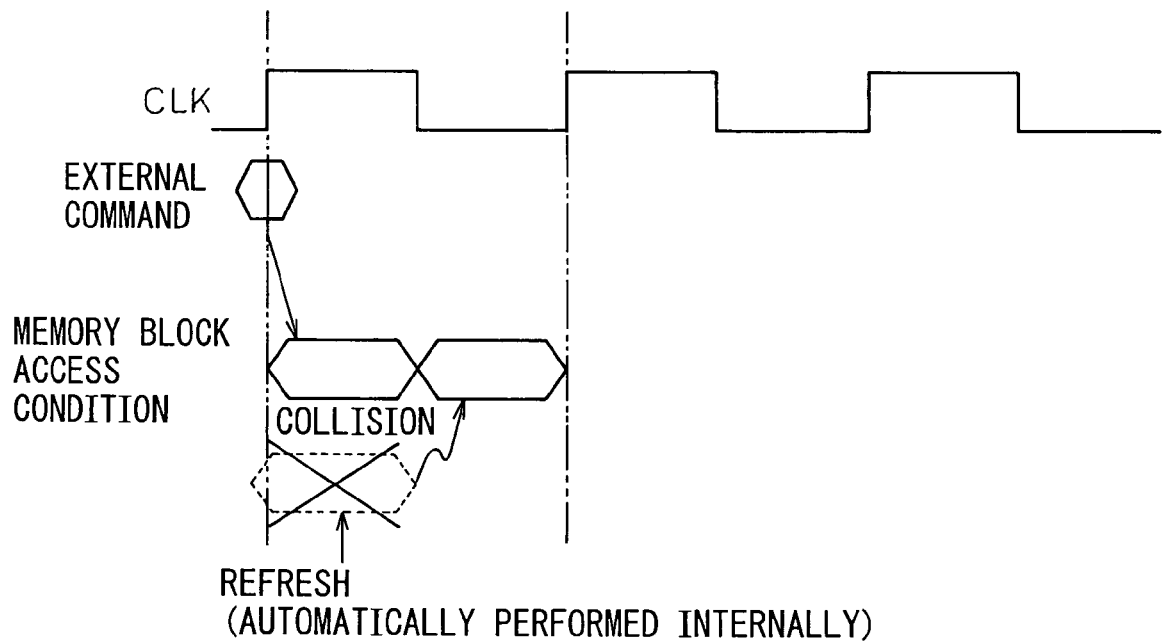
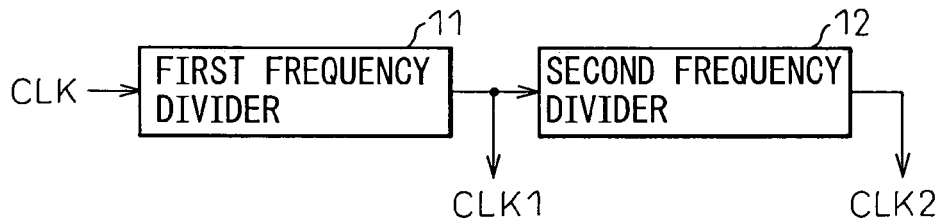
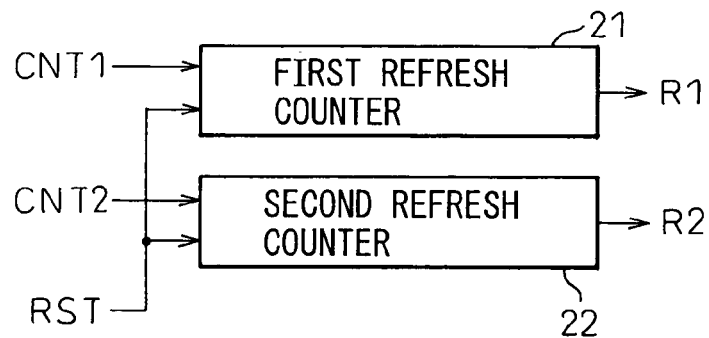

DYNAMIC SEMICONDUCTOR MEMORY REDUCING THE FREQUENCY OF OCCURRENCE OF REFRESH COMMAND REQUEST AND REFRESH CONTROL METHOD THEREOF

CROSS REFERENCE TO RELATED APPLICATION

This application is based upon and claims the benefit of priority from, the prior Japanese Patent Application No. 2006-093827, filed on Mar. 30, 2006, the entire contents of which are incorporated herein by reference.

BACKGROUND OF THE INVENTION

1. Field of the Invention

The present invention relates to a dynamic semiconductor memory which requires periodic refreshing to preserve data, and a refresh control method thereof.

2. Description of the Related Art

Dynamic memory that can be integrated on a logic chip (SoC memory: System-On-a-Chip memory) has been finding widespread use in recent years. Compared with a discrete (single) memory, the SoC memory can achieve higher data transfer rates because the data input/output bit width can be increased. It also offers the advantage of reducing the system current consumption, since the wiring load for logic-to-memory connection is greatly reduced.

More specifically, when, for example, a discrete dynamic semiconductor memory (DRAM) is used such as a memory used in a personal computer, access speed is slow and power consumption increases, but when a DRAM is embedded into a SoC, not only can the access speed be increased and the power consumption reduced, but also the size can be reduced and performance increased.

However, in the case of the SoC memory, compared with a discrete dynamic semiconductor memory, it is difficult to increase the size of a capacitor for holding data, and also, the cell leakage current is relatively large; for these and other reasons, the memory cell data retention time (tREF) of the SoC memory is generally short.

Here, when the total bit count of the dynamic semiconductor memory is denoted by T, and the number of bits accessed in one refresh (data retention) operation by R, then the refresh operation must be performed T/R times within the tREF time. This means that the number of refresh operations per unit time must be increased as tREF becomes shorter.

In the prior art SoC memory, this issue has been addressed, for example, by reducing T (the total bit count) or by increasing R (the number of bits accessed in one refresh operation) as much as possible compared with a discrete memory, and the reduced tREF time has not been much of a problem. Further, the problem has also been solved by performing the usual memory access and the refresh access in a time-division fashion and by not requesting an external refresh command.

In the prior art, Japanese Unexamined Patent Publication (Kokai) No. 2003-173676 discloses a semiconductor storage device in which, when contention occurs between a refresh operation and an external access request for the same data, the external access is accomplished in a time apparently equal to one memory core operation; to achieve this, multiple bits of data having the same address are distributed across a plurality of memory cell blocks, and the refresh operations of the plurality of memory cell blocks are controlled independently of each other so that the refresh operations of a first memory cell block and a second memory cell block are performed with different timings.

Further, in the prior art, Japanese Unexamined Patent Publication (Kokai) No. 2000-163956 discloses a semiconductor storage device that allows an access operation and a refresh operation to be performed simultaneously to the same bank; in this device, a plurality of bit line groups are respectively connected to a plurality of first sense line groups via first switch means and also to a plurality of second sense line groups via second switch means, and the first and second switch means are controlled independently of each other to enable data to be read out of memory cells simultaneously selected by a certain activated word line, while at the same time, refreshing data in memory cells simultaneously selected by another activated word line.

The prior art and its associated problems will be described later with reference to the accompanying drawings.

SUMMARY OF THE INVENTION

An object of the present invention is to provide a dynamic semiconductor memory that can reduce the frequency of occurrence of a refresh command request and that does not require a time-division operation, and a refresh control method for the same.

According to the present invention, there is provided a dynamic semiconductor memory having a plurality of memory blocks, each of the memory blocks having a sense amplifier and a memory core formed from memory cells located at intersections between a plurality of word lines and a plurality of bit lines connected to the sense amplifier, wherein the memory blocks are sequentially refreshed by selecting each of the word lines and by simultaneously activating the memory cells connected to the selected word line by the sense amplifier, the dynamic semiconductor memory comprising a first refresh counter which outputs a first internal refresh candidate address; and a second refresh counter which outputs a second internal refresh candidate address that is different from the first internal refresh candidate address, wherein in a refresh operation, when an externally accessed address coincides with the first internal refresh candidate address, the refresh operation is performed starting from the second internal refresh candidate address.

The first refresh counter may comprise a first counter which counts a first count signal and outputs the first internal refresh candidate address, and the second refresh counter may comprise a second counter which counts a second count signal, and a complement conversion circuit which converts an output of the second counter into its complement and outputs the complement as the second internal refresh candidate address.

The first refresh counter may comprise a first word line address counter which counts a first count signal and outputs a first word line internal refresh candidate address, and a first block address counter which counts a carry signal generated by the first word line address counter and outputs a first block memory internal refresh candidate address, and the second refresh counter may comprise a second word line address counter which counts a second count signal and outputs a second word line internal refresh candidate address, and a second block address counter which counts a carry signal generated by the second word line address counter and outputs a second block memory internal refresh candidate address.

The first word line address counter and the first block address counter may be initially set to indicate lowest order bits of a word line address and a block address, respectively, and are incremented in accordance with the first count signal, and the second word line address counter and the second block address counter may be initially set to indicate highest order bits of the word line address and the block address, respectively, and are decremented in accordance with the second count signal. In a refresh operation, when an externally accessed block address does not coincide with the first block memory internal refresh candidate address, the refresh operation may be performed starting from the first internal refresh candidate address, and in the refresh operation, when the externally accessed block address coincides with the first block memory internal refresh candidate address, the refresh operation may be performed starting from the second internal refresh candidate address.

The refresh operation may be performed in accordance with a refresh signal generated based on a periodic control signal. The dynamic semiconductor memory may further comprise a first frequency divider which generates a first clock signal by frequency-dividing the periodic control signal by a first division factor, wherein the refresh signal is generated in synchronism with the first clock signal.

The periodic control signal may be a system clock signal applied from outside the dynamic semiconductor memory. The dynamic semiconductor memory may further comprise a second frequency divider which generates a second clock signal by frequency-dividing the periodic control signal by a second division factor that is different from the first division factor.

The dynamic semiconductor memory may further comprise a second frequency divider which generates a second clock signal by frequency-dividing a different periodic control signal than the periodic control signal. The different periodic control signal may be a time clock signal.

The dynamic semiconductor memory may further comprise an oscillator which generates a second clock signal. The refresh operation is initiated in accordance with the second clock signal, and when the refresh operation is completed for all the memory cells in accordance with the first clock signal, the refresh operation may be thereafter not performed until the second clock signal is applied next time. The refresh operation may be performed concurrently with an external access operation to the dynamic semiconductor memory.

Further, according to the present invention, there is provided a refresh control method for a dynamic semiconductor memory comprising a plurality of memory blocks, each of the memory blocks having a memory cell array and a common sense-amplifier group of sense amplifiers that are simultaneously activated in a refresh operation, wherein first and second different refresh block candidates are preselected from among the plurality of memory blocks, and the refresh operation is performed on one or the other of the first and second memory blocks.

The refresh operation may be performed in accordance with a refresh signal generated based on a periodic control signal. The periodic control signal may be a system clock applied from outside the dynamic semiconductor memory. The refresh signal may be generated in synchronism with a first clock signal generated by frequency-dividing the periodic control signal by a first division factor.

The refresh operation is initiated in accordance with a second clock signal generated by frequency-dividing the periodic control signal by a second division factor that is different from the first division factor, the refresh operation then being sequentially performed on all the memory cells in accordance with the first clock signal, and when the refresh operation is completed for all the memory cells, the refresh operation may be thereafter not performed until the second clock signal is applied next time.

A second clock signal different in frequency from the first clock signal is created, and wherein the refresh operation is initiated in accordance with the second clock signal, the refresh operation then being sequentially performed on all the memory cells in accordance with the periodic control signal, and when the refresh operation is completed for all the memory cells, the refresh operation may be thereafter not performed until the second clock signal is applied next time. The second clock signal may be generated based on a different periodic control signal than the periodic control signal. The different periodic control signal may be applied from outside the dynamic semiconductor memory. The different periodic control signal may be a time clock signal.

The different periodic control signal may be generated within the dynamic semiconductor memory. The different periodic control signal may be an output signal of an oscillator included in the dynamic semiconductor memory.

The refresh operation may be performed concurrently with an external access operation to the dynamic semiconductor memory. When an external access operation to the dynamic semiconductor memory does not coincide either one of the preselected first and second refresh block candidates, the refresh operation may be performed on the first refresh block candidate. When an externally accessed block in the dynamic semiconductor memory coincides with the second refresh block candidate, the refresh operation may be performed on the first refresh block candidate. When an externally accessed block in the dynamic semiconductor memory coincides with the first refresh block candidate, the refresh operation may be performed on the second refresh block candidate.

In addition, according to the present invention, there is also provided a refresh control method for a dynamic semiconductor memory comprising a plurality of memory blocks, each of the memory blocks having a memory cell array and a common sense-amplifier group of sense amplifiers that are simultaneously activated in a refresh operation, wherein in each of the memory blocks, a logical address of a word line selected to refresh a row of memory cells is called a refresh word line address, and a memory block address to be refreshed and a word line address to be refreshed are collectively called a refresh address, and a first refresh address and a second refresh address are respectively generated by a first refresh counter and a second refresh counter each having an independent reset function.

Each of the first and second refresh counters may comprise a word line address counter which generates a word line internal refresh candidate address; and a block address counter which generates a block memory internal refresh candidate address by counting a carry signal generated by the word line address counter. A count signal may be applied to the first refresh counter, which generates the first refresh address, or the second refresh counter, which generates the second refresh address, whichever corresponds to the refreshed memory block.

The first refresh counter and the second refresh counter may be initially set to indicate a lowest order bit and a highest order bit, respectively. When a count signal is input to the refresh counter that is initially set to indicate the lowest order bit, the refresh counter may be incremented, and when a count signal is input to the refresh counter that is initially set to indicate the highest order bit, the refresh counter may be decremented.

The first refresh counter may comprise a first counter which counts a first count signal and outputs the first internal refresh candidate address, and the second refresh counter may comprise a second counter which counts a second count signal, and a complement conversion circuit which converts an output of the second counter into its complement and outputs the complement as the second internal refresh candidate address. When a first refresh block and a second refresh block both indicate the same block address, and when the refresh operation is completed for all word line addresses in the block, the first and second refresh counters may be reset. When the first refresh counter has counted up to the address that coincides with the block address indicated by the second refresh block, thereafter only the second refresh address may be taken as a refresh address candidate until the first and second refresh counters are reset. When the second refresh address coincides with an externally accessed block address, the refresh operation may not be performed.

When a first refresh block and a second refresh block both indicate the same block address, a busy signal may be continually output until the refresh operation is completed for all word line addresses in the block.

When a first refresh block and a second refresh block both indicate the same block address, and when a second clock signal is applied, a busy signal may be continually output until the refresh operation is completed for all word line addresses in the block. The period of the second clock signal may be not longer than data retention time of the dynamic semiconductor memory.

A refresh command may be requested N times with a time equal to tREF/2−tCY×(M−1)×N, where M is the total number of refresh blocks, N is the total number of word lines in each block, tREF is the memory cell data retention time, and tCY is the period of a first clock. A busy signal may be output automatically and periodically with a period not longer than {tREF/2−tCY ×(M−1)×N}/N.

BRIEF DESCRIPTION OF THE DRAWINGS

The present invention will be more clearly understood from the description of the preferred embodiments as set forth below with reference to the accompanying drawings, wherein:

FIG. 3 is a diagram for explaining one example of a refresh operation in the dynamic semiconductor memory shown in FIG. 1;

FIGS. 4A and 4B are block diagrams showing the essential portions of a first embodiment of a dynamic semiconductor memory according to the present invention;

DESCRIPTION OF THE PREFERRED EMBODIMENTS

Before describing the embodiments of the present invention in detail, one example of the dynamic semiconductor memory and its associated problem will be described with reference to FIGS. 1 to 3.

Figure 1:
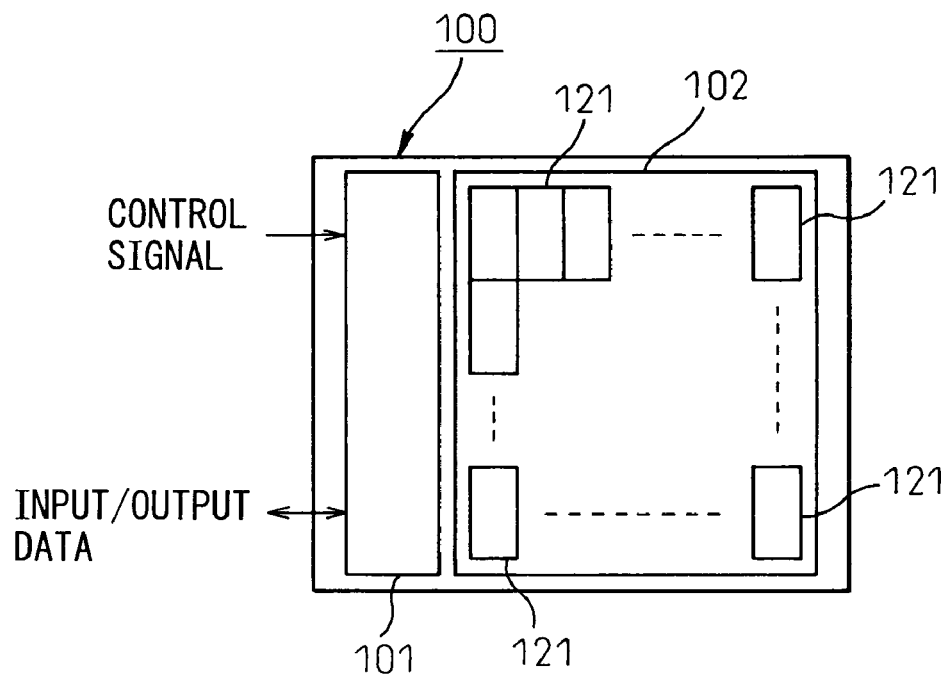
FIG. 1 is a block diagram showing one example of a dynamic semiconductor memory.

FIG. 1 is a block diagram showing one example of the dynamic semiconductor memory. In FIG. 1, reference numeral 100 is the dynamic semiconductor memory, 101 is peripheral circuitry, 102 is a memory core, and 121 is an array of memory blocks. While the present invention is suitable for application to SoC memories such as DRAMs integrated on logic chips, the invention is not necessarily limited to SoC memories but can be applied to various kinds of dynamic semiconductor memories.

As shown in FIG. 1, the conventional dynamic semiconductor memory 100 comprises the peripheral circuitry 101, such as a memory core control circuit and a power supply circuit, and the memory core 102 constructed from the plurality of memory blocks 121.

The peripheral circuitry 101 controls the transfer of data to and from the outside world by controlling the operation of the memory core 102 in accordance with a control signal supplied from outside the semiconductor memory 100, or controls the supply of power that is needed for the operation of the memory core 102 and the peripheral circuitry 101. The memory core 102 comprises the plurality of memory blocks 121, for example, 256 memory blocks 121.

Figure 2:
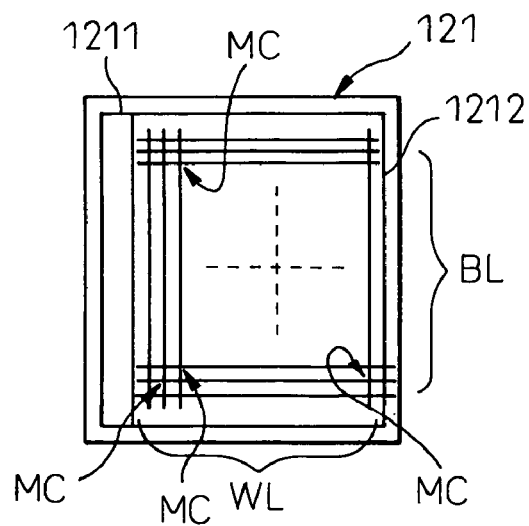
FIG. 2 is a diagram showing by way of example the organization of one memory block in the dynamic semiconductor memory shown in FIG. 1.

FIG. 2 is a diagram showing by way of example the organization of one memory block in the dynamic semiconductor memory shown in FIG. 1.

As shown in FIG. 2, the memory block 121 comprises a sense amplifier 1211 and a memory cell array 1212 formed from a plurality of memory cells MCs located at intersections between a plurality of word lines WLs and a plurality of bit lines BLs connected to the sense amplifier 1211. The sense amplifier 1211 is provided to amplify the data read out (via a bit line BL) from a memory cell MC selected by a word line (row select line) WL, or to write externally supplied data or refresh the data stored in the memory cell MC.

In the dynamic semiconductor memory 100, each memory cell, which comprises a transistor and a capacitor, for example, stores data in the form of a charge (or lack of charge) stored on the capacitor; because of this cell structure, the charge stored on the capacitor necessarily leaks away, and the lost charge must be re-injected (rewritten) at predetermined intervals of time. This rewrite operation performed at predetermined intervals of time is the refresh operation.

That is, in the dynamic semiconductor memory 100, data in each memory cell MC selected by a word line WL is amplified by the sense amplifier 1211 via a bit line BL, and the data is thus rewritten (refreshed) into the memory cell MC selected by the word line WL.

The sense amplifier 1211, which is actually a grouping of sense amplifiers, is common to the plurality of memory cells MCs in the memory cell block 121. More specifically, the memory cells MCs connected to any given sense amplifier 1211 in the memory cell block 121 are selected one at a time by a word line WL. In other words, within the same block 121, only the memory cells MCs connected in common to one word line WL can be refreshed at a time, and the refreshing cannot be performed by selecting two or more word lines WLs simultaneously.

Here, when the total number of memory blocks 121 in the semiconductor memory 100 is denoted by M, and the total number of word lines WLs in each memory block 121 is N, then the refresh operation must be performed M×N times to refresh all the memory cells MCs contained in the semiconductor memory 100. Since every cell must be refreshed within tREF (the memory cell data retention time), the time beyond which the data retained in the memory cell is lost, the refresh operation must be continually performed M×N or more times within tREF.

Accordingly, if the refresh operation is to be performed by applying an external command, the input of the refresh command will have to be requested M×N or more times within the memory cell data retention time tREF. On the other hand, when automatically performing the refreshing internally within the semiconductor memory 100, a time-division operation becomes necessary to avoid a collision between an external access block and a refresh block.

FIG. 3 is a diagram for explaining one example of the refresh operation performed in the dynamic semiconductor memory shown in FIG. 1, i.e., the time-division operation.

The refresh (internal refresh) automatically performed within the semiconductor memory 100 is accomplished by periodically performing the refresh operation with respect to refresh addresses automatically generated by a prescribed counter; therefore, it is difficult to avoid an access block collision that can occur due to a randomly given external access.

More specifically, as shown in FIG. 3, when a collision occurs between the memory block (121) accessed (specified) by the external command and the memory block specified by the internal refresh address automatically generated within the semiconductor memory, the refresh of the memory block is performed, for example, by delaying the timing as shown. Accordingly, the time-division operation is performed with the timing such as shown in FIG. 3, by assuming in advance the collision that can occur between the memory block accessed by the external command and the memory block accessed by the internal refresh.

In recent years, the need to increase the capacity of SoC memory and to reduce the cycle time has been growing rapidly. However, if the number of bits to be accessed in one refresh (data retention) operation (denoted by R in the earlier description) is increased, for example, the current consumption during the access increases, making it difficult to design the power supply that can handle it.

On the other hand, with the method that performs the usual access and a refresh access successively in one access operation, the cycle time (access time) increases. One possible approach to reducing the increase in the access time would be to reduce the lengths of the word lines WLs and bit lines BLs, but in that case, the overall size (area) of the memory core 102 would increase, that is, the manufacturing cost would increase.

The embodiments of a dynamic semiconductor memory and its refresh control method according to the present invention will be described in detail below with reference to the accompanying drawings.

FIGS. 4A and 4B are block diagrams showing the essential portions of a first embodiment of a dynamic semiconductor memory according to the present invention. In FIGS. 4A and 4B, reference numeral 11 is a first frequency divider, 12 is a second frequency divider, 21 is a first refresh counter, and 22 is a second refresh counter.

As shown in FIG. 4A, a system clock signal CLK (for example, 100 MHz) is supplied to the semiconductor memory (100); this system clock signal CLK is frequency-divided by the first frequency divider 11 (for example, by a factor of 2) to produce a first clock signal CLK1 (for example, 50 MHz), and the output signal (CLK1) of the first frequency divider 11 is further frequency-divided by the second frequency divider 12 (for example, by a factor of $10^4$) to produce a second clock signal CLK2 (for example, 5 KHz).

Here, the second clock signal CLK2 can also be produced by directly frequency-dividing the system clock signal CLK. The system clock signal CLK of 100 MHz, the first clock signal CLK1 of 50 MHz, and the second clock signal CLK2 of 5 KHz are only examples, and these clock signal frequencies can be chosen as desired. Further, instead of the frequency dividers, PLL (Phase Locked Loop) circuits or the like may be used to generate the clock signals of desired frequencies; furthermore, the second clock signal CLK2, for example, may be separately applied from the outside. It is, however, required that at least the relation P0≦P1≦P2 hold among the period P0 of the system clock signal CLK, the period P1 of the first clock signal CLK1, and the period P2 of the second clock signal CLK2.

In FIG. 4B, reference characters R1 and R2 indicate internal refresh candidate addresses (first and second refresh block candidates), and the internal refresh candidate addresses R1 and R2 are output from the first and second refresh counters 21 and 22, respectively. The first and second refresh counters 21 and 22 are respectively supplied with count signals CNT1 and CNT2 and are also supplied with a common reset signal RST.

The internal refresh candidate addresses R1 and R2 each comprise the address of a word line WL (word line address) and the address of a block 121 (block address). Here, the block address refers to the address signal for selecting one of the plurality of memory blocks in the dynamic semiconductor integrated memory, for example, a designated one of 256 memory blocks 0 to 255, while the word line address refers to the address signal for selecting one of the plurality of word lines in one memory block, for example, a designated one of 16 word lines 0 to 15 contained in one memory block 121.

In the internal refresh candidate address R1, the LSB (Least Significant Bit, the lowest order bit) for specifying, for example, the memory block 0 or the word line 0 is set as the initial value, and in the internal refresh candidate address R2, the MSB (Most Significant Bit, the highest order bit) for specifying, for example, the memory block 255 or the word line 15 is set as the initial value.

Figure 5:
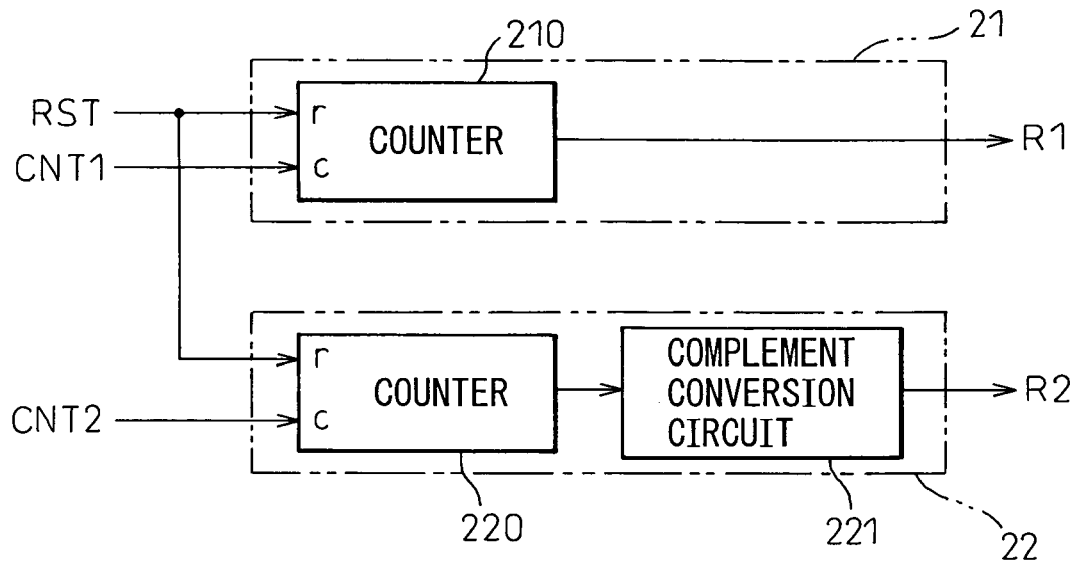
FIG. 5 is a block diagram showing refresh counters in one embodiment of the dynamic semiconductor memory according to the present invention.
Figure 6:
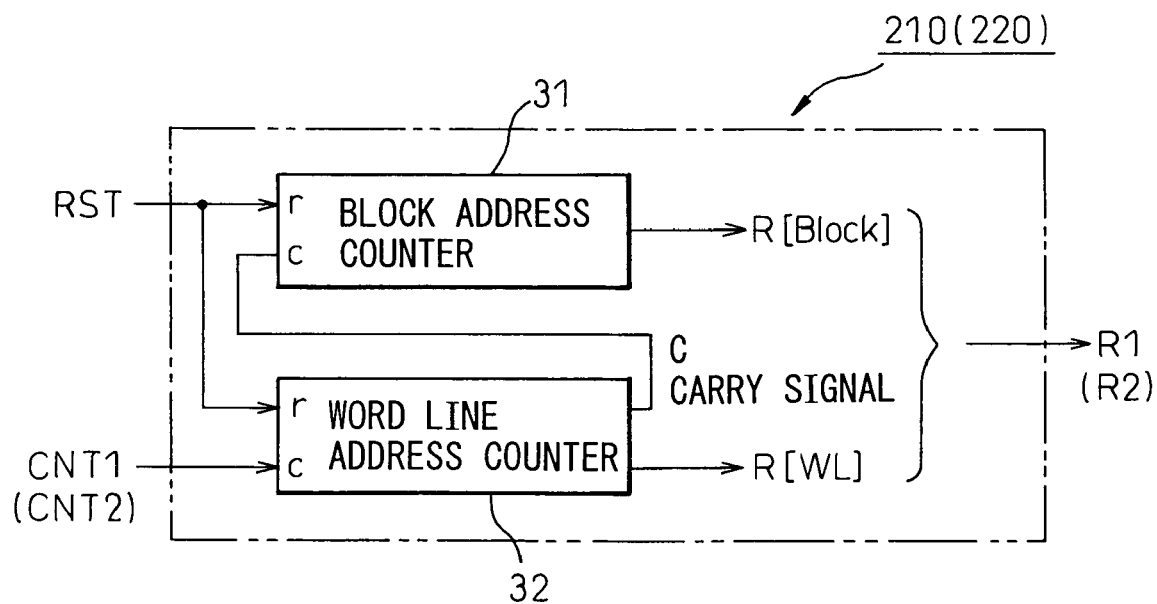
FIG. 6 is a block diagram showing one example of the counter section of each of the refresh counters according to the present invention shown in FIG. 5.

FIG. 5 is a block diagram showing the refresh counters in one embodiment of the dynamic semiconductor memory according to the present invention, and FIG. 6 is a block diagram showing one example of the counter section of each of the refresh counters according to the present invention shown in FIG. 5.

As shown in FIG. 5, the first refresh counter 21 comprises a counter 210 to which are applied as inputs the first count signal CNT1 and the reset signal RST, and the second refresh counter 22 comprises a counter 220 to which are applied as inputs the second count signal CNT2 and the reset signal RST, and a complement conversion circuit 221 which receives the output of the counter 220 and converts it into its complement.

As shown in FIG. 6, the counter 210 (220) comprises a word line address counter 32 to which are applied as inputs the reset signal RST and the count signal CNT1 (CNT2) for counting the word line WL address, and a block address counter 31 to which are applied as inputs the reset signal RST and a carry signal produced by the word line address counter 32.

When the reset signal RST is applied, the word line address counter 32 resets the word line internal refresh candidate address R[WL], for example, to the LSB (least significant bit address: all 0s), and when the count signal CNT1 is applied, the word line address counter 32 increments the word line internal refresh candidate address R[WL].

The word line address counter 32 outputs not only the word line internal refresh candidate address R[WL] but also the carry signal C. The carry signal C is output when the word line internal refresh candidate address R[WL] after being incremented up to the MSB (most significant bit address: all 1s) returns to the LSB, and this carry signal C is supplied to the block address counter 31.

The block address counter 31 counts the carry signal C supplied from the word line address counter 32, and outputs the block memory internal refresh candidate address R[Block].

Here, the reset signal RST is applied to both the block address counter 31 and the word line address counter 32, but the count signal CNT1 (CNT2) is applied only to the count terminal of the word line address counter 32.

As shown in FIG. 5, the entirety of the first refresh counter 21 comprises the counter 210 shown in FIG. 6, and the reset signal RST and the first count signal CNT1 are input to the counter 210, which then outputs the word line internal refresh candidate address R[WL] and the block memory internal refresh candidate address R[Block] as the internal refresh candidate address R1.

On the other hand, the second refresh counter 22 comprises the counter 210 shown in FIG. 6 and the complement conversion circuit 221, and the reset signal RST and the second count signal CNT2 are input to the counter 210, whose output signal is converted to its complement to output the word line internal refresh candidate address R[WL] and the block memory internal refresh candidate address R[Block] as the internal refresh candidate address R2. In the case of a 4-bit signal, for example, the complement conversion circuit 221 outputs "1111" when the output signal of the counter 210 is "0000", "0111" when the signal is "1000", and "1011" when the signal is "0100".

Figure 7:
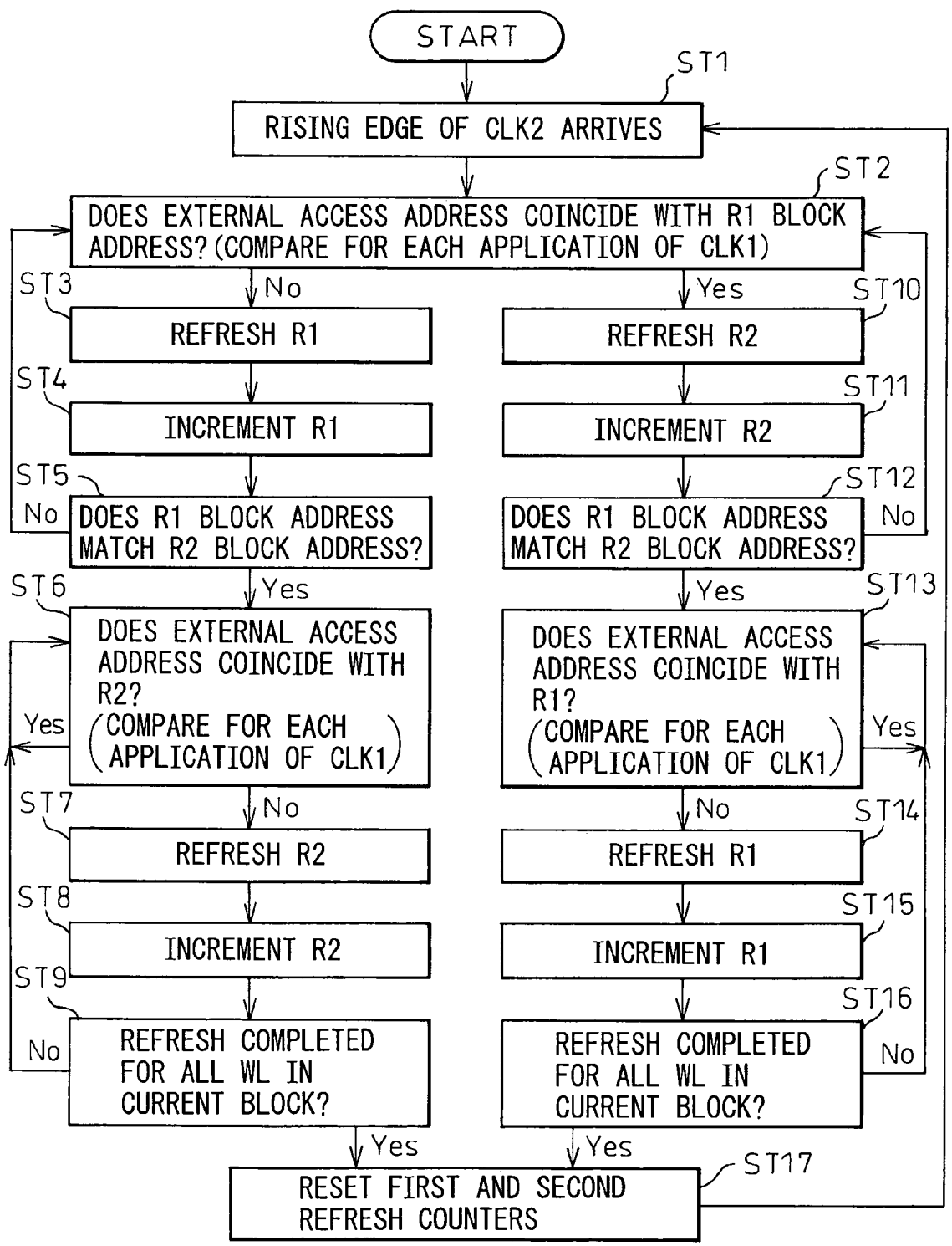
FIG. 7 is a flowchart for explaining one example of a refresh control method for the dynamic semiconductor memory according to the present invention.
Figure 8:
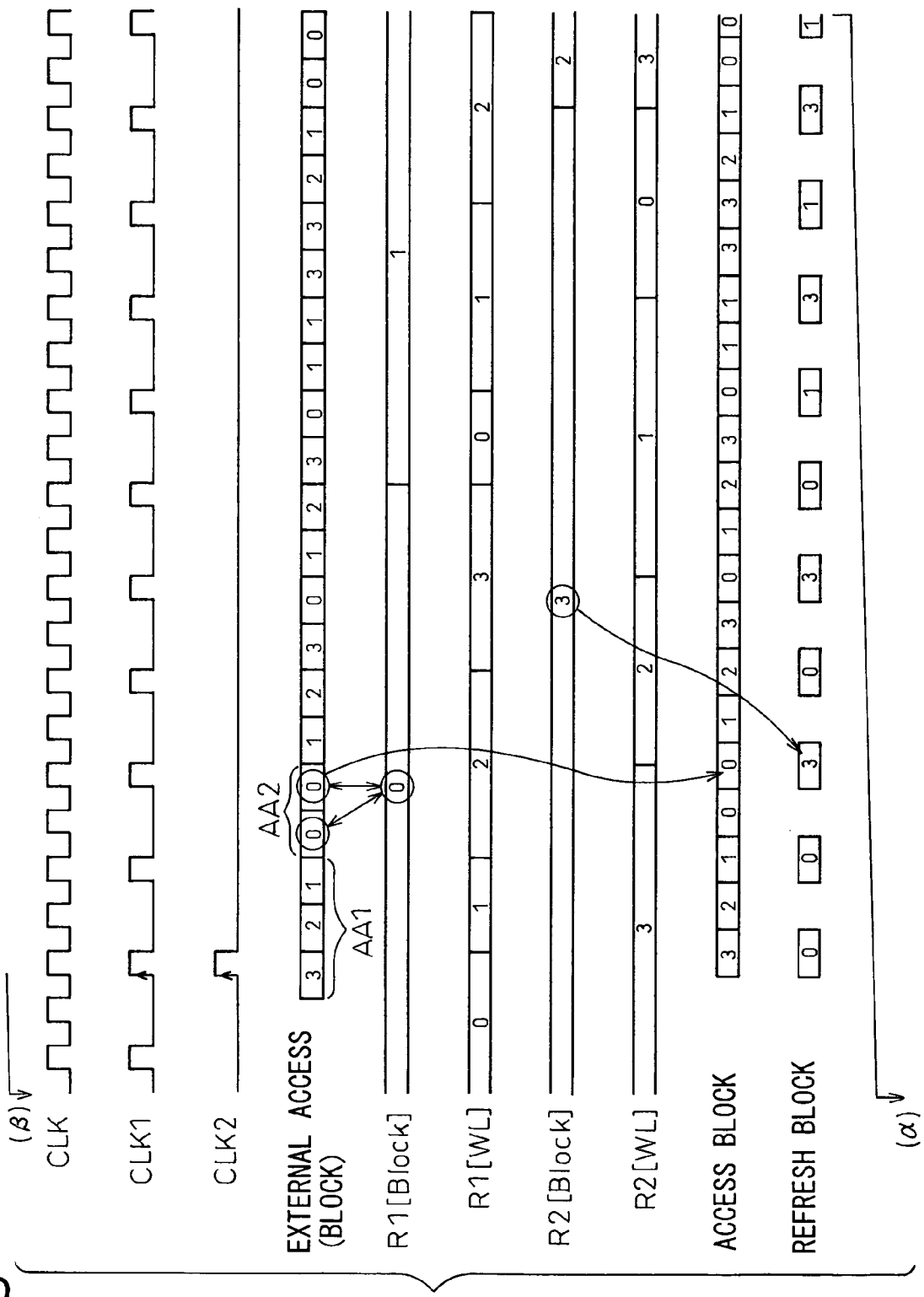
FIG. 8 is a timing diagram (part 1) for explaining one example of the refresh control method for the dynamic semiconductor memory according to the present invention.
Figure 9:
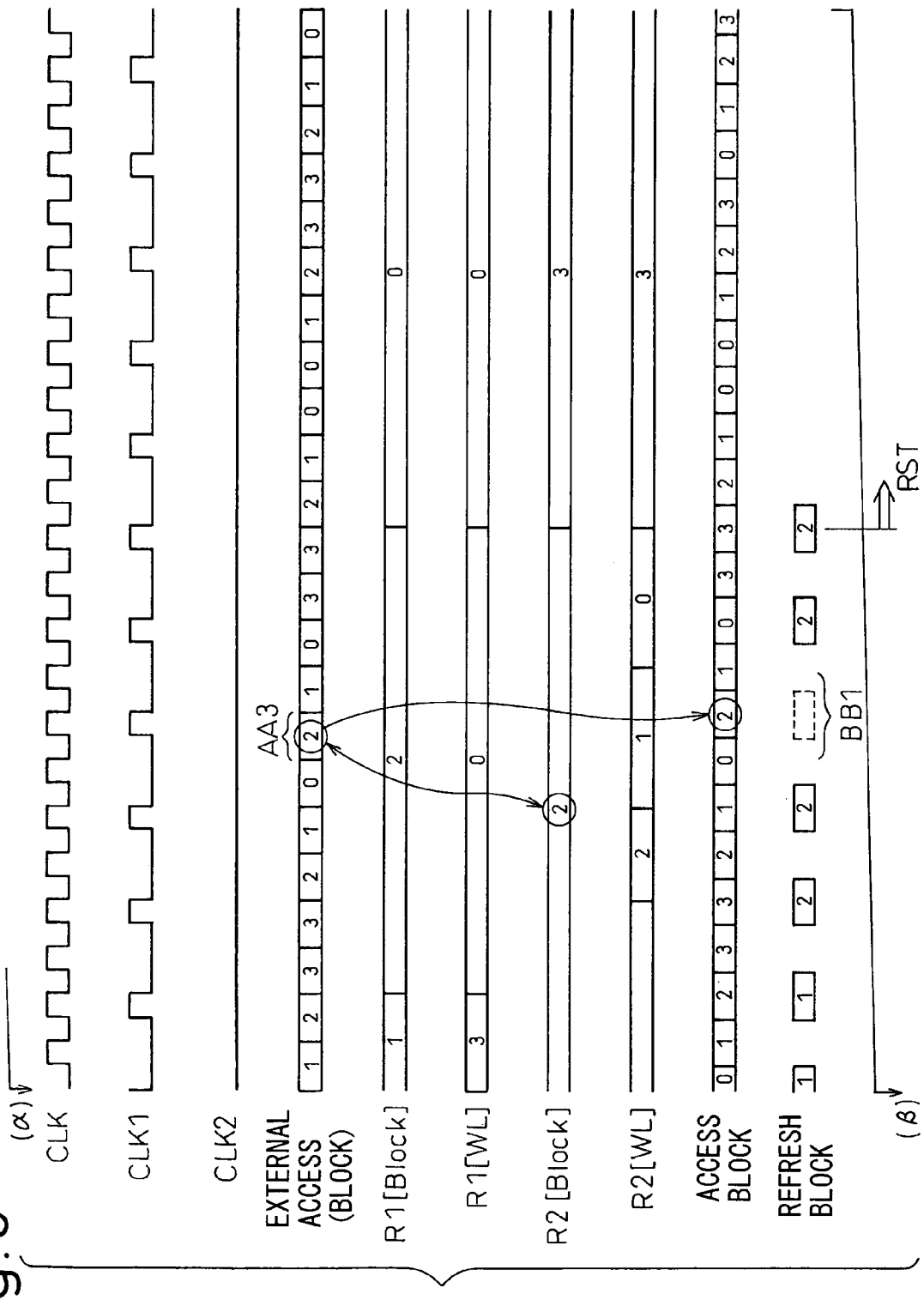
FIG. 9 is a timing diagram (part 2) for explaining one example of the refresh control method for the dynamic semiconductor memory according to the present invention.

FIG. 7 is a flowchart for explaining one example of the refresh control method for the dynamic semiconductor memory according to the present invention, and FIGS. 8 and 9 are timing diagrams for explaining one example of the refresh control method for the dynamic semiconductor memory according to the present invention. For simplicity of explanation, the example shown in FIGS. 7 to 9 assumes the case where the memory core 102 is constructed from four memory blocks 121 (memory blocks 0 to 3, designated by 2-bit addresses "00" to "11") each containing four word lines WLs (word lines 0 to 3, designated by 2-bit addresses "00" to "11"). FIGS. 8 and 9 show the timing of each signal waveform during one cycle period of the second clock signal CLK2, and (α) in FIG. 8 continues to (α) in FIG. 9, while (β) in FIG. 9 continues to (β) in FIG. 8.

As shown in FIG. 8, the initial state of the first internal refresh candidate address R1 indicates that the first block memory internal refresh candidate address R1[Block] is "0" (lowest order bits "00") and that the first word line internal refresh candidate address R1[WL] is "0" (lowest order bits "00"), while the initial state of the second internal refresh candidate address R2 indicates that the second block memory internal refresh candidate address R2[Block] is "3" (highest order bits "11") and that the second word line internal refresh candidate address R2[WL] is "3" (highest order bits "11").

As shown in FIGS. 7 and 8, when the refresh control process of the dynamic semiconductor memory according to the present invention is initiated, first the process waits in step ST1 for the arrival of the rising edge of the second clock signal CLK2 having the longest clock cycle (for example, a 5-KHz clock) and, when the rising edge of the second clock signal CLK2 arrives, the refresh operation starts in synchronism with the first clock signal CLK1 (for example, a 50-MHz clock). The refresh operation is performed in accordance with a refresh signal generated based, for example, on the periodic first clock signal CLK1.

In the refresh operation, as shown in step ST2, for each application of the first clock CLK1 the address of the externally accessed block (the memory block specified by the external access address) is compared with the address of the memory block in which the first refresh is to be performed (the memory block specified by the first internal refresh candidate address R1). If it is determined in step ST2 that the external address does not coincide with R1, the process proceeds to step ST3.

More specifically, as shown in FIG. 8, when the memory block specified by the external access address changes in the order of 3, 2, 1, 0, 0, 1, and so on, R1[Block] continues to indicate the block 0; therefore, in the period during which the memory block specified by the external access address changes from 3 to 2 to 1 (indicated by AA1 in FIG. 8), the externally accessed memory block does not coincide with the block 0 specified by R1[Block], and the process therefore proceeds to step ST3.

In step ST3, the memory block (block 0) specified by R1 is refreshed, and the process proceeds to step ST4 where R1 is incremented before proceeding to step ST5.

That is, in the example of FIG. 8, the first externally accessed block is "3" which does not coincide with the block specified by R1[Block] (="0"); therefore, the refresh operation is performed with respect to R1, while at the same time, allowing an access to be made to the external access address (step ST3), and after that, R1[WL] is incremented ("0"→"1": step ST4). At the next clock timing, since the first clock signal CLK1 is not applied, only the access operation to the external access address is performed, and the addresses of R1 and R2 are held unchanged.

Then, at the next clock timing, since the first clock signal CLK1 is applied, as shown in FIG. 8, the external access block (="1") is compared with R1[Block] (="0") (step ST2), and again, they do not match (No in step ST2); therefore, as in the preceding refresh operation, the refresh operation is performed with respect to R1, while at the same time, allowing an access to be made to the external access address (step ST3), and after that, R1[WL] is incremented ("1"→"2": step ST4).

At the next clock timing, since the first clock signal CLK1 is not applied, only the access operation to the external access address is performed, and the addresses of R1 and R2 are held unchanged. Then, at the next clock timing, since the first clock signal CLK1 is applied, the external access block (="0") is compared with R1 (="0") (step ST2), and in this case, they match (Yes in step ST2); therefore, the refresh operation is performed with respect to R2, while at the same time, allowing an access to be made to the external access address (step ST10), and after that, R2[WL] (the word line internal refresh candidate address) is incremented (in this case, decremented from "3" to "2": step ST11).

Thereafter, the above sequence of operations is repeated until R1 matches R2 (steps ST5 and ST12).

In step ST5, it is determined whether R1 matches R2 and, if it is determined that R1 does not match R2 (No), the process returns to step ST2.

Here, in the first internal refresh candidate address R1, for example, when the first word line internal refresh candidate address R1[WL] is sequentially incremented in step ST4 from the lowest order bits "00" up to the highest order bits "11" and is further incremented to return to the lowest order bits "00", the carry signal (indicated by reference character C in FIG. 6) is output, and the first block memory internal refresh candidate address R1[Block] is incremented from the lowest order bits "00" to "01" (memory block "0" to "1").

If the thus incremented R1[Block] (the block memory internal refresh candidate address in the first internal refresh candidate address R1) coincides, for example, with the R2[Block] (the block memory internal refresh candidate address in the second internal refresh candidate address R2) initially set to the highest order bits "11", then it is determined in step ST5 that R1 matches R2 (Yes), and the process proceeds to step ST6.

Here, when R1 thus incremented matches the block specified by R2 (Yes in step ST5), then thereafter only the address of R2 is taken as the refresh candidate (steps ST6 to ST9).

Accordingly, for example, when the memory block specified by the external access address is "block 2" (AA3 in FIG. 9), since it coincides with R2[Block] (="2") (Yes in step ST6), priority is given to the access block, and the refresh operation is not performed (BB1 in FIG. 9). When the refreshing is completed for all the word lines (all WLs) in all the memory blocks (Yes in step ST9), R1 and R2 are reset (RST in FIG. 9), and the refresh operation is suspended until the next second clock signal CLK2 is applied.

That is, in step ST6, for each application of the first clock signal CLK1 the external access address is compared with R2. If it is determined in step ST6 that the external access address coincides with R2 (Yes), the refresh operation is not performed, and the process waits for the arrival of the next refresh timing; if it is determined that the external access address does not coincide with R2 (No), the process proceeds to step ST7.

In step ST7, the memory block (block 3) specified by R2 is refreshed, and the process proceeds to step ST8 where R2 is incremented (decremented if R2 is initially set to the highest order bits) before proceeding to step ST9.

In step ST9, it is determined whether the refreshing is completed for all the word lines WLs in the current memory block and, if it is determined that the refreshing is not yet completed for all the word lines WLs in the current memory block (No), the process from steps ST6 to ST9 is repeated; on the other hand, if it is determined that the refreshing is completed for all the word lines WLs in the current memory block (Yes), the process proceeds to step ST17.

On the other hand, if, in step ST2, which is performed for each application of the first clock signal CLK1, it is determined that the external access address coincides with R1, the process proceeds to step ST10 where the memory block specified by R2 is refreshed, after which the process proceeds to step ST11 where R2 is incremented (decremented) before proceeding to step ST12.

More specifically, as earlier described with reference to FIG. 8, when the memory block specified by the external access address changes in the order of 3, 2, 1, 0, 0, 1, and so on, R1[Block] continues to indicate the block 0; therefore, in the period during which the memory block specified by the external access address changes from 3 to 2 to 1 (indicated by AA1 in FIG. 8), the externally accessed memory block does not coincide with the block 0 specified by R1[Block].

However, in the period during which the memory block specified by the external access address is "block 0" (AA2 in FIG. 8), the externally accessed memory block coincides with the block 0 specified by R1[Block]; therefore, the block 0 is not refreshed, but the memory block specified by R2 is refreshed. That is, since R2[Block] continues to indicate the block 3 as shown in FIG. 8, the memory block 3 which is different from the memory block 0 specified by the external access address is refreshed.

Here, as previously stated, the initial state of R1 (the first internal refresh candidate address) indicates that R1[Block] (the first block memory internal refresh candidate address) is "0" (lowest order bits "00") and that R1[WL] (the first word line internal refresh candidate address) is "0" (lowest order bits "00"), while the initial state of R2 (the second internal refresh candidate address) indicates that R2[Block] (the second block memory internal refresh candidate address) is "3" (highest order bits "11") and that R2[WL] (the second word line internal refresh candidate address) is "3" (highest order bits "11"); as a result, when the external address coincides with R1, the external address always does not coincide with R2, and therefore, the memory block specified by R2 is refreshed.

The above-described process of steps ST10 to ST12 and the process of steps ST13 to ST16 hereinafter described are the same as the earlier described process of steps ST3 to ST5 and the process of steps ST6 to ST9, respectively, except that R1 and R2 are interchanged.

In step ST12, it is determined whether R1 matches R2 and, if it is determined that they do not match, the process returns to step ST2 to repeat the same processing; on the other hand, if it is determined that they match, the process proceeds to step ST13.

Here, in R2, for example, when R2[WL] is sequentially incremented (decremented) in step ST11 from the highest order bits "11", and R2[WL] is decremented from the lowest order bits "00" to return to the highest order bits "11", the carry signal is output, and R2[Block] is decremented from the highest order bits "11" (the memory block "3").

If the thus decremented R2[Block] coincides, for example, with the block memory internal refresh candidate address R1[Block] in R1 initially set to the lowest order bits "00", then it is determined in step ST12 that R1 matches R2, and the process proceeds to step ST13.

In step ST13, for each application of the first clock signal CLK1 the external access address is compared with R1. If it is determined in step ST13 that the external access address coincides with R1, the processing in step ST13 is repeated, and if it is determined that the external access address does not coincide with R1, the process proceeds to step ST14.

In step ST14, the memory block specified by R1 is refreshed, and the process proceeds to step ST15 where R1 is incremented before proceeding to step ST16.

In step ST16, it is determined whether the refreshing is completed for all the word lines WLs in the current memory block, and the process of steps ST13 to ST16 is repeated until the refreshing is completed for all the word lines WLs in the current memory block; then, when it is determined that the refreshing is completed for all the word lines WLs in the current memory block, the process proceeds to step ST17.

In step ST17, the first and second refresh counters 21 and 22 are reset, and the process waits until the next second clock CLK2 is applied. That is, R1 (R1[Block] and R1[WL]) and R2 (R2[Block] and R2[WL]) are reset to their initial states.

As can be understood from the above description, the refresh operation itself is synchronized to the first clock signal CLK1, but when the sequence of operations is completed, the refresh operation is suspended until the next second clock signal CLK2 is applied. That is, the sequence of refresh operations is repeated with the period of the second clock signal CLK2.

For simplicity of explanation, the example shown in FIGS. 7 to 9 has been described by assuming the case where the number of memory blocks is four with each memory block containing four word lines WLs, but it will be appreciated that various memory organizations, for example, the number of memory blocks being 256 with each memory block containing 16 word lines, can be employed according to the specification of the dynamic semiconductor memory required.

Figure 10:
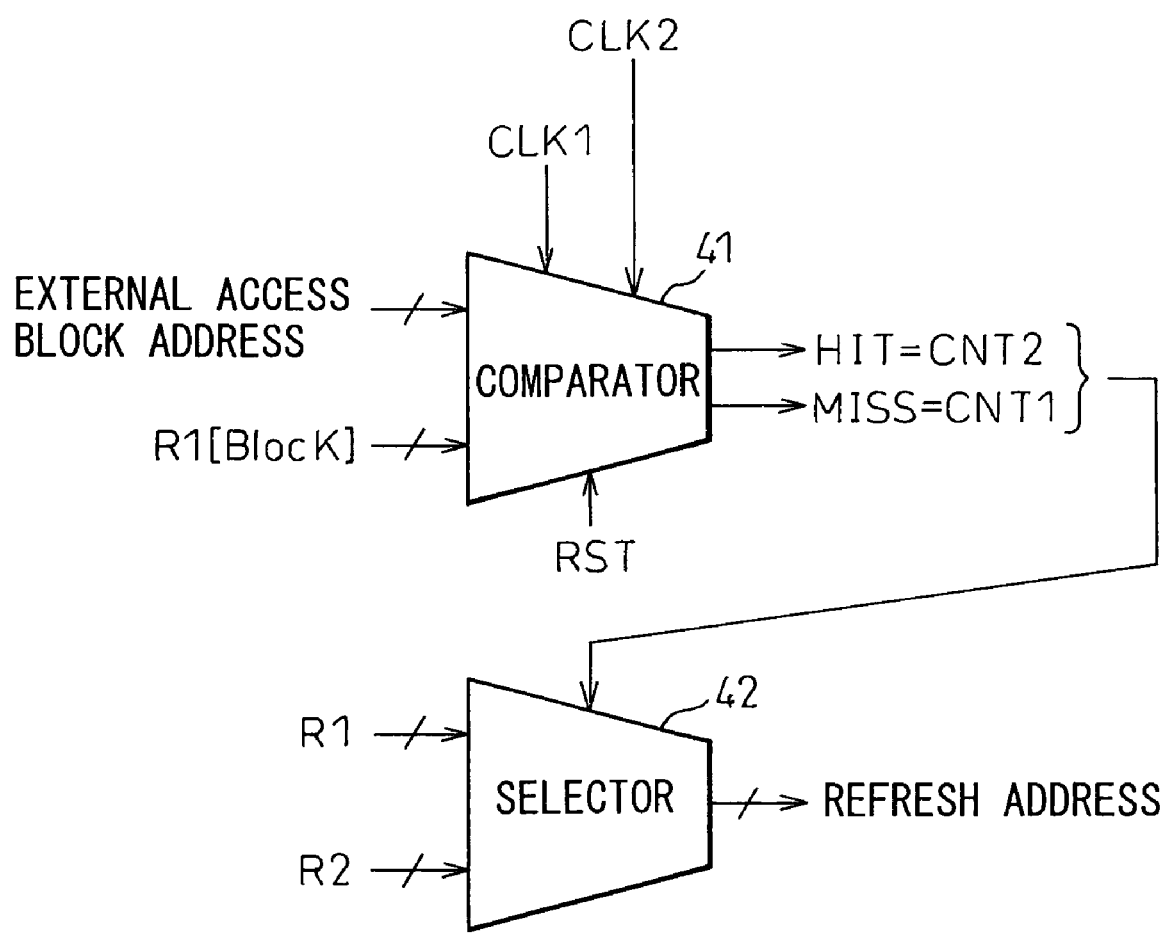
FIG. 10 is a diagram for explaining refresh address generation in one embodiment of the dynamic semiconductor memory according to the present invention.

FIG. 10 is a diagram for explaining refresh address generation in one embodiment of the dynamic semiconductor memory according to the present invention; the diagram here shows an example of the configuration for implementing the generation of the first and second count signals CNT1 and CNT2 and the selection of the first and second internal refresh candidate addresses R1 and R2.

A comparator 41 compares the input external access block address with the block memory internal refresh candidate address R1[Block] in R1 in synchronism with the application of the first clock signal CLK1, and outputs a match signal HIT or a mismatch signal MISS as the result of the comparison.

The match signal HIT and the mismatch signal MISS are respectively used as the first and second count signals CNT1 and CNT2 as the count signals for R1 and R2. Here, the second clock signal CLK2 and the reset signal RST are also input to the comparator 41, the reset signal RST being the same as the reset signal applied to the first and second refresh counters 21 and 22 described with reference to FIGS. 4B and 5, and the comparison operation is performed in synchronism with the application of the first clock signal CLK1 after the second clock signal CLK2 is applied; on the other hand, when the reset signal RST is applied, the comparator 41 is placed in a standby state (does not perform the comparison operation) until the next second clock signal CLK2 is applied.

Rather than performing such control, the comparison operation might be performed simply in synchronism with the first clock signal CLK1, but in that case, the comparison operation irrelevant to the refresh operation would also be performed.

A selector 42 selects either R1 or R2 for output, depending on the state of the match signal HIT and/or the mismatch signal MISS. More specifically, in the example described with reference to FIGS. 7 to 9, when the comparator 41 outputs the match signal (HIT), R2 is selected, and when the comparator 41 outputs the mismatch signal (MISS), R1 is selected, and the thus selected address is output as the refresh address.

In the above operation, there arises a problem, for example, when external accesses always concentrate on the same memory block; in the example described with reference to FIGS. 7 to 9, consider the situation where external accesses continually occur to the memory block 0. At first, the external access and the refresh operation are performed concurrently, but R2 continues to decrement, and when the refresh of the memory block 1 is completed, the first and second internal refresh candidate addresses R1 and R2 both indicate the same memory block 0; once this happens, the refresh operation can no longer be performed (because external accesses continue to occur to the memory block 0).

There are two major ways to address this problem. One is to output a busy signal from the semiconductor memory, with provisions made not to accept external accesses while the busy signal is being output, thereby enabling the refresh operation to be performed preferentially. The other is to provide for a periodic input of a refresh command in the specification of the semiconductor memory so that the refresh operation is performed preferentially when the refresh command is input. With these provisions, it becomes possible to perform refreshing on all the memory cells even in a situation where external accesses continue to concentrate on the same memory block.

Figure 11:
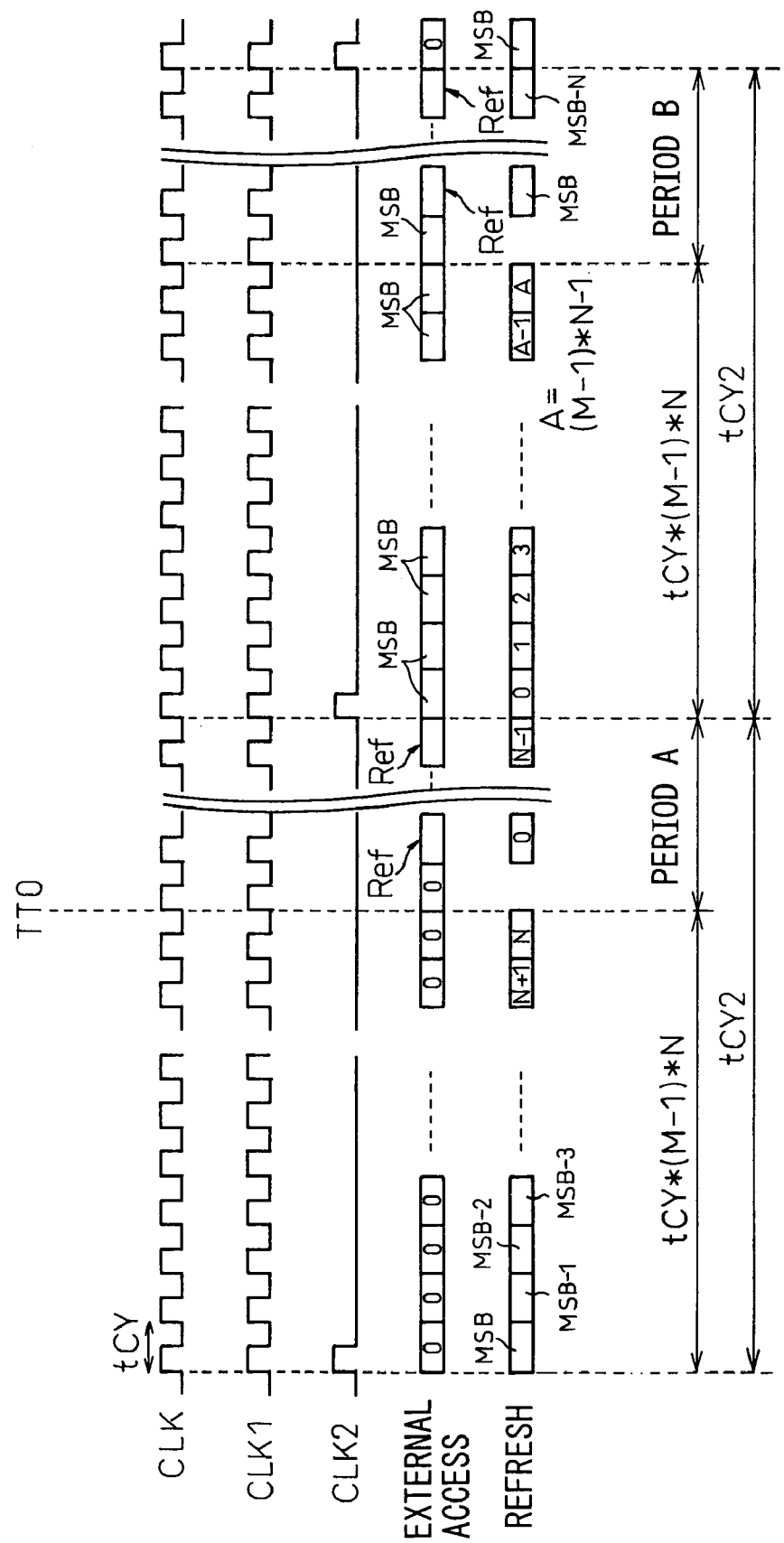
FIG. 11 is a timing diagram for explaining the case where accesses are concentrated on a particular memory block in one embodiment of the dynamic semiconductor memory according to the present invention.

FIG. 11 is a timing diagram for explaining the case where accesses are concentrated on a particular memory block in one embodiment of the dynamic semiconductor memory according to the present invention. Referring to FIG. 11, a further detailed description will be given of how the above situation where external accesses continue to concentrate on the same memory block is handled.

In FIG. 11, it is assumed that CLK=CLK1 (division factor=1), the number of memory blocks=M, the number of word lines WLs in each memory block=N, LSB (Least Significant Bit)=0, and MSB (Most Significant Bit)=M×N−1.

In FIG. 11, when external accesses are concentrated at address 0 (=LSB), since the LSB "00" corresponds to the block 0, the address comparison after initiation of the refresh operation always produces a HIT (match) result with respect to R1 (the first internal refresh candidate address), so that the refresh operation proceeds by using the address of R2 (the second internal refresh candidate address).

That is, using R2, the refresh starts from MSB and proceeds in the order of MSB-1, MSB-2, and so on, and the external access and the refresh operation proceed concurrently until N is reached. However, when the refresh is completed for R2=N, since the block address in R2 indicates the block 0, the comparison with the external access address produces a HIT result, so that thereafter the refresh operation continues to be suspended. In FIG. 11, the refreshing of the other memory blocks than the block 0 has been completed by the time TT0.

FIG. 11 shows the case where the refresh command Ref is externally given during period A in order to ensure that the last block (block 0) remaining unrefreshed is refreshed without fail.

In the example shown in FIG. 11, since the number of word lines WLs in one memory block is N, all the memory cells can be refreshed if the refresh command Ref is given N times during the period A before the next timing of CLK2 arrives.

Here, when the period of CLK is denoted by tCY, and the period of CLK2 by tCY2, the length of the period A is given by tCY2−tCY×(M−N)×N(=tR). This shows that the refresh command Ref should be given at average intervals of tR/N (=tCY2/N−tCY×(M−N)).

Next, consider the case where external accesses are concentrated at MSB (=M×N−1) after the period A. When external accesses are concentrated at MSB, since MSB corresponds to the block "M−1", the address comparison after initiation of the refresh operation always produces a MISS (mismatch) result with respect to R1, so that the refresh operation proceeds by using the address of R1.

That is, using R1, the refresh starts from LSB and proceeds in the order of 0, 1, 2, and so on, and the external access and the refresh operation proceed concurrently until (M−1)×N−1 is reached. However, when the refresh is completed for R1=

(M−1)×N−1, since the block address in R1 indicates the block "31 1", the comparison with the external access address produces a HIT result, so that thereafter the refresh operation continues to be suspended.

As in the earlier described case, the refresh command Ref is externally given during the period B in order to ensure that the last block remaining unrefreshed is refreshed without fail. That is, if the refresh command Ref is given N times during the period B before the next timing of CLK2 arrives, all the memory cells can be refreshed.

Here, when attention is paid to the interval at which the block corresponding to MSB is refreshed, it can be seen that the refresh interval for this block is 2×tCY2. Since the length of (2×tCY2) needs to be shorter than the memory cell data retention time tREF, the relation $tCY2 \leq tREF/2$ must be satisfied.

This means that the data in the memory cell can be retained if the refresh command Ref is issued N times within the period of (tREF/2−tCY×(M−1)×N). That is, it is required that, for any X, the time interval between the Xth refresh command and the (X+N)th refresh be not longer than the period of (tREF/2−tCY×(M−1)×N).

In the above-described first embodiment, the second clock signal CLK2 has been described as being derived by frequency-dividing the system clock CLK, but the frequency of CLK differs depending on the system used, while on the other hand, the period of CLK2 must be set by considering the memory cell data retention time; therefore, a problem may occur if the period of CLK2 varies depending on the period of CLK.

Figure 12:
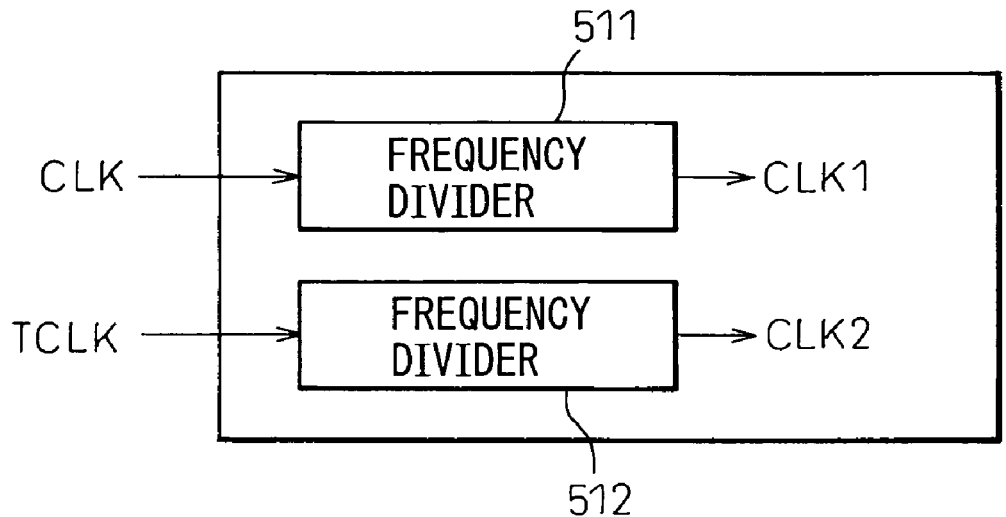
FIG. 12 is a block diagram showing an essential portion of a second embodiment of the dynamic semiconductor memory according to the present invention.
Figure 13:
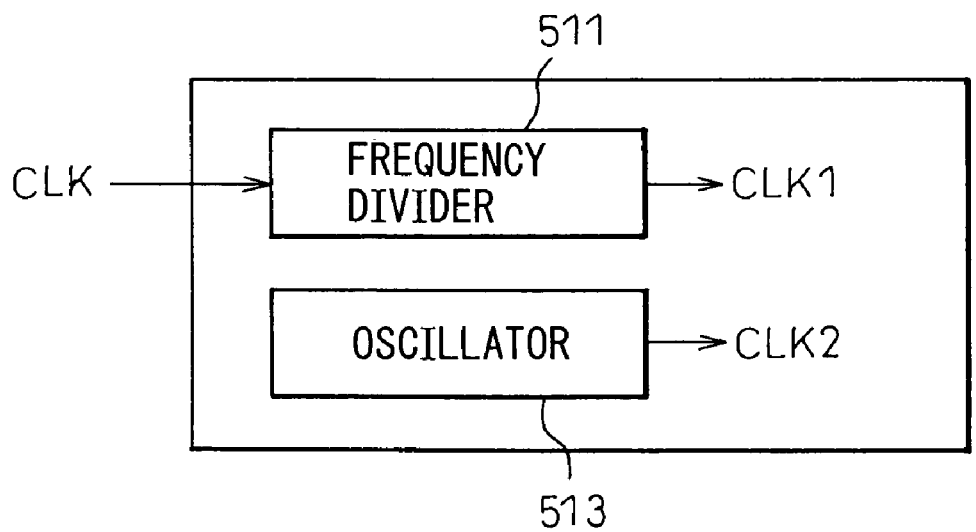
FIG. 13 is a block diagram showing an essential portion of a third embodiment of the dynamic semiconductor memory according to the present invention.

In such cases, CLK2 can be generated by using a clock different than CLK, as in the second and third embodiments shown in FIGS. 12 and 13.

FIG. 12 is a block diagram showing an essential portion of the second embodiment of the dynamic semiconductor memory according to the present invention, and FIG. 13 is a block diagram showing an essential portion of the third embodiment of the dynamic semiconductor memory according to the present invention.

As shown in FIG. 12, in the dynamic semiconductor memory of the second embodiment, the first clock signal CLK1 is generated by dividing the frequency of the system clock signal CLK by a frequency divider 511, and the second clock signal CLK2 is generated by dividing the frequency of a time clock TCLK by a frequency divider 512. Here, the time clock TCLK is the clock commonly provided in an apparatus, for example, an information apparatus such as a portable telephone, to which the dynamic semiconductor memory of the present invention is applied, and the second clock signal CLK2 is derived from this time clock TCLK.

As shown in FIG. 13, in the dynamic semiconductor memory of the third embodiment, the first clock signal CLK1 is generated by dividing the frequency of the system clock signal CLK by the frequency divider 511, while the second clock signal CLK2 is directly generated by using an oscillator 513. The oscillator 513 here can be constructed, for example, from a ring oscillator by connecting an odd number of inverters.

FIG. 11 has shown an example in which the refresh command Ref is inserted in the system that uses the semiconductor memory, in order to ensure that the last block remaining unrefreshed is refreshed without fail; on the other hand, as an alternative example, a busy signal may be output from the semiconductor memory periodically at intervals of tR/N (=tCY2/N−tCY×(M−N)), with provisions made not to accept external accesses but to preferentially perform the internal refresh operation while the busy signal is being output.

Alternatively, control may be performed to output busy signals, starting from the time that R1 and R2 indicate the same block, until refreshing of all the memory cells is completed. In this case, the busy signal is output N times in succession.

Provisions may also be made so that, when the next CLK2 arrives while there still are memory cells remaining unrefreshed, busy signals are output in succession until refreshing of all the remaining memory cells is completed. In this case, since the number of addresses remaining to be refreshed is N at the maximum, the busy signal is output a maximum of N times in succession; however, when the external access addresses are not concentrated at any particular addresses but are randomly distributed, the probability of any addresses remaining unrefreshed until arrival of the next CLK2 is extremely low, and in this case, an improvement in access efficiency can be expected because there is hardly any need to output busy signals. However, in this method, since the block remaining unrefreshed is refreshed after arrival of the next CLK2, the period of CLK2 must be set to satisfy the relation $tCY2 \leq tREF/2 - tCY1 \times N$.

Here, the probability of any addresses remaining unrefreshed until arrival of the next CLK2 can be obtained as shown below for the case where the external access addresses are not concentrated at any particular addresses but are randomly distributed. In a specific example, when M=128, N=32, tREF=200 μsec, and tCY=tCY1=10 ns, then the length of the period A is calculated as 160 μsec from tREF/2−tCY×(M−1)×N, and the number of accesses during the period A is 16,000. All the unrefreshed addresses cannot be refreshed within the period A when the number of accesses to other than the unrefreshed block (=one block) is 0 to N−1. More specifically, for example, the probability of the number being 0 is COMBIN{16000, 0}×(1/128)^16000×(127/128)^0, the probability of the number being 1 is COMBIN{16000, 1}×(1/128)^15999×(127/128)^1, the probability of the number being 2 is COMBIN{16000, 2}×(1/128)^15998×(127/128)^2, the probability of the number being 3 is COMBIN{16000, 3}×(1/128)^15997×(127/128)^3,

. . .

the probability of the number being 31 is COMBIN{16000, 31}×(1/128)^15969×(127/128)^31.

The sum of the above is the probability that all the unrefreshed addresses cannot be refreshed within the period A; when calculated, the probability is nearly zero. That is, when the external access addresses are not concentrated at any particular addresses but are randomly distributed, the probability of any unrefreshed addressed being unable to be refreshed within the period A (period B) is nearly zero. Therefore, in the case of the method in which, when the next CLK2 arrives while there still are memory cells remaining unrefreshed, busy signals are output in succession until refreshing of all the remaining memory cells is completed, it can be seen that the probability of the busy signal actually being output is nearly zero.

As described in detail above, according to the present invention, by controlling the refresh block so as to avoid a collision between the external access block and the refresh block wherever possible, and thereby allowing the external access and the refresh operation to be performed concurrently, it becomes possible to prevent the cycle time from increasing, as would be the case, for example, when the refresh operation were performed in a time-division fashion. Further, if there are any memory blocks for which the refresh operation cannot be performed without incurring a collision, then refresh commands are given only to such memory blocks to accomplish the refreshing; using this strategy, the frequency of command input can be drastically reduced compared with the prior art that requires giving refresh commands to all the memory blocks to accomplish the refreshing.

In this way, according to the present invention, it becomes possible to provide a dynamic semiconductor memory that can reduce the frequency of occurrence of a refresh command request and that does not require a time-division operation, and a refresh control method for the same.

While the present invention is suitable for application to SoC memories such as DRAMs integrated on logic chips, the invention is not necessarily limited to SoC memories but can be applied to various kinds of dynamic semiconductor memories.

Many different embodiments of the present invention may be constructed without departing from the scope of the present invention, and it should be understood that the present invention is not limited to the specific embodiments described in this specification, except as defined in the appended claims.

What is claimed is:

1. A dynamic semiconductor memory having a plurality of memory blocks, each of said memory blocks having a sense amplifier and a memory core formed from memory cells located at intersections between a plurality of word lines and a plurality of bit lines connected to said sense amplifier, wherein said memory blocks are sequentially refreshed by selecting each of said word lines and by simultaneously activating said memory cells connected to said selected word line by said sense amplifier, said dynamic semiconductor memory comprising:
   a first refresh counter which outputs a first internal refresh candidate address; and
   a second refresh counter which outputs a second internal refresh candidate address that is different from said first internal refresh candidate address,
   wherein in a refresh operation, when an externally accessed address coincides with said first internal refresh candidate address, said refresh operation is performed starting from said second internal refresh candidate address.

2. The dynamic semiconductor memory as claimed in claim 1, wherein said first refresh counter comprises a first counter which counts a first count signal and outputs said first internal refresh candidate address, and said second refresh counter comprises a second counter which counts a second count signal, and a complement conversion circuit which converts an output of said second counter into its complement and outputs said complement as said second internal refresh candidate address.

3. The dynamic semiconductor memory as claimed in claim 1, wherein said first refresh counter comprises a first word line address counter which counts a first count signal and outputs a first word line internal refresh candidate address, and a first block address counter which counts a carry signal generated by said first word line address counter and outputs a first block memory internal refresh candidate address, and said second refresh counter comprises a second word line address counter which counts a second count signal and outputs a second word line internal refresh candidate address, and a second block address counter which counts a carry signal generated by said second word line address counter and outputs a second block memory internal refresh candidate address.

4. The dynamic semiconductor memory as claimed in claim 3, wherein said first word line address counter and said first block address counter are initially set to indicate lowest order bits of a word line address and a block address, respectively, and are incremented in accordance with said first count signal, and said second word line address counter and said second block address counter are initially set to indicate highest order bits of said word line address and said block address, respectively, and are decremented in accordance with said second count signal.

5. The dynamic semiconductor memory as claimed in claim 3, wherein in a refresh operation, when an externally accessed block address does not coincide with said first block memory internal refresh candidate address, said refresh operation is performed starting from said first internal refresh candidate address, and in said refresh operation, when said externally accessed block address coincides with said first block memory internal refresh candidate address, said refresh operation is performed starting from said second internal refresh candidate address.

6. The dynamic semiconductor memory as claimed in claim 1, wherein said refresh operation is performed in accordance with a refresh signal generated based on a periodic control signal.

7. The dynamic semiconductor memory as claimed in claim 6, further comprising: a first frequency divider which generates a first clock signal by frequency-dividing said periodic control signal by a first division factor, wherein said refresh signal is generated in synchronism with said first clock signal.

8. The dynamic semiconductor memory as claimed in claim 7, wherein said periodic control signal is a system clock signal applied from outside said dynamic semiconductor memory.

9. The dynamic semiconductor memory as claimed in claim 7, further comprising:
   a second frequency divider which generates a second clock signal by frequency-dividing said periodic control signal by a second division factor that is different from said first division factor.

10. The dynamic semiconductor memory as claimed in claim 9, wherein said refresh operation is initiated in accordance with said second clock signal, and when said refresh operation is completed for all said memory cells in accordance with said first clock signal, said refresh operation is thereafter not performed until said second clock signal is applied next time.

11. The dynamic semiconductor memory as claimed in claim 10, wherein said refresh operation is performed concurrently with an external access operation to said dynamic semiconductor memory.

12. The dynamic semiconductor memory as claimed in claim 7, further comprising:
   a second frequency divider which generates a second clock signal by frequency-dividing a different periodic control signal than said periodic control signal.

13. The dynamic semiconductor memory as claimed in claim 12, wherein said different periodic control signal is a time clock signal.

14. The dynamic semiconductor memory as claimed in claim 12, wherein said refresh operation is initiated in accordance with said second clock signal, and when said refresh operation is completed for all said memory cells in accordance with said first clock signal, said refresh operation is thereafter not performed until said second clock signal is applied next time.

15. The dynamic semiconductor memory as claimed in claim 14, wherein said refresh operation is performed concurrently with an external access operation to said dynamic semiconductor memory.

16. The dynamic semiconductor memory as claimed in claim 7, further comprising:
an oscillator which generates a second clock signal.

17. The dynamic semiconductor memory as claimed in claim 16, wherein said refresh operation is initiated in accordance with said second clock signal, and when said refresh operation is completed for all said memory cells in accordance with said first clock signal, said refresh operation is thereafter not performed until said second clock signal is applied next time.

18. The dynamic semiconductor memory as claimed in claim 17, wherein said refresh operation is performed concurrently with an external access operation to said dynamic semiconductor memory.

19. A refresh control method for a dynamic semiconductor memory comprising a plurality of memory blocks, each of said memory blocks having a memory cell array and a common sense-amplifier group of sense amplifiers that are simultaneously activated in a refresh operation, wherein
first and second different refresh block candidates are preselected from among said plurality of memory blocks, and
said refresh operation is performed on one or the other of said first and second memory blocks in accordance with a first clock signal generated based on a first periodic control signal,
wherein the refresh operation is initiated in accordance with a second clock signal generated based on a second periodic control signal which is different form the first periodic control signal, and
wherein, after the refresh operation is completed for all said memory cells in accordance with the first clock signal, the refresh operation is performed in accordance with the second clock which is supplied next.

20. The refresh control method for a dynamic semiconductor memory as claimed in claim 19, wherein said refresh operation is performed in accordance with a refresh signal generated based on the first periodic control signal.

21. The refresh control method for a dynamic semiconductor memory as claimed in claim 20, wherein said first periodic control signal is a system clock applied from outside said dynamic semiconductor memory.

22. The refresh control method for a dynamic semiconductor memory as claimed in claim 20, wherein said refresh signal is generated in synchronism with a first clock signal generated by frequency-dividing said first periodic control signal by a first division factor.

23. The refresh control method for a dynamic semiconductor memory as claimed in claim 22, wherein the second clock signal is generated by frequency-dividing said second periodic control signal by a second division factor that is different from said first division factor.

24. The refresh control method for a dynamic semiconductor memory as claimed in claim 19, wherein said second periodic control signal is applied from outside said dynamic semiconductor memory.

25. The refresh control method for a dynamic semiconductor memory as claimed in claim 24, wherein said different periodic control signal is a time clock signal.

26. The refresh control method for a dynamic semiconductor memory as claimed in claim 19, wherein said second periodic control signal is generated within said dynamic semiconductor memory.

27. The refresh control method for a dynamic semiconductor memory as claimed in claim 26, wherein said different periodic control signal is an output signal of an oscillator included in said dynamic semiconductor memory.

28. The refresh control method for a dynamic semiconductor memory as claimed in claim 19, wherein said refresh operation is performed concurrently with an external access operation to said dynamic semiconductor memory.

29. The refresh control method for a dynamic semiconductor memory as claimed in claim 19, wherein when an external access operation to said dynamic semiconductor memory does not coincide either one of said preselected first and second refresh block candidates, said refresh operation is performed on said first refresh block candidate.

30. The refresh control method for a dynamic semiconductor memory as claimed in claim 29, wherein when an externally accessed block in said dynamic semiconductor memory coincides with said second refresh block candidate, said refresh operation is performed on said first refresh block candidate.

31. The refresh control method for a dynamic semiconductor memory as claimed in claim 29, wherein when an externally accessed block in said dynamic semiconductor memory coincides with said first refresh block candidate, said refresh operation is performed on said second refresh block candidate.

32. A refresh control method for a dynamic semiconductor memory comprising a plurality of memory blocks, each of said memory blocks having a memory cell array and a common sense-amplifier group of sense amplifiers that are simultaneously activated in a refresh operation, wherein
in each of said memory blocks, a logical address of a word line selected to refresh a row of memory cells is called a refresh word line address, and a memory block address to be refreshed and a word line address to be refreshed are collectively called a refresh address, and
a first refresh address and a second refresh address are respectively generated by a first refresh counter and a second refresh counter each having independent increment function.

33. The refresh control method for a dynamic semiconductor memory as claimed in claim 32, wherein each of said first and second refresh counters comprises:
a word line address counter which generates a word line internal refresh candidate address; and
a block address counter which generates a block memory internal refresh candidate address by counting a carry signal generated by said word line address counter.

34. The refresh control method for a dynamic semiconductor memory as claimed in claim 32, wherein a count signal is applied to said first refresh counter, which generates said first refresh address, or said second refresh counter, which generates said second refresh address, whichever corresponds to said refreshed memory block.

35. The refresh control method for a dynamic semiconductor memory as claimed in claim 32, wherein said first refresh counter and said second refresh counter are initially set to indicate a lowest order bit and a highest order bit, respectively.

36. The refresh control method for a dynamic semiconductor memory as claimed in claim 35, wherein when a count signal is input to said refresh counter that is initially set to indicate the lowest order bit, said refresh counter is incremented, and when a count signal is input to said refresh counter that is initially set to indicate the highest order bit, said refresh counter is decremented.

37. The refresh control method for a dynamic semiconductor memory as claimed in claim 32, wherein said first refresh counter comprises a first counter which counts a first count signal and outputs said first internal refresh candidate address, and said second refresh counter comprises a second counter which counts a second count signal, and a complement conversion circuit which converts an output of said second counter into its complement and outputs said complement as said second internal refresh candidate address.

38. The refresh control method for a dynamic semiconductor memory as claimed in claim 32, wherein when a first refresh block and a second refresh block both indicate the same block address, and when said refresh operation is completed for all word line addresses in said block, said first and second refresh counters are reset.

39. The refresh control method for a dynamic semiconductor memory as claimed in claim 38, wherein when said first refresh counter has counted up to the address that coincides with the block address indicated by said second refresh block, thereafter only said second refresh address is taken as a refresh address candidate until said first and second refresh counters are reset.

40. The refresh control method for a dynamic semiconductor memory as claimed in claim 39, wherein when said second refresh address coincides with an externally accessed block address, said refresh operation is not performed.

41. The refresh control method for a dynamic semiconductor memory as claimed in claim 32, wherein when a first refresh block and a second refresh block both indicate the same block address, a busy signal is continually output until said refresh operation is completed for all word line addresses in said block.

42. The refresh control method for a dynamic semiconductor memory as claimed in claim 32, wherein when a first refresh block and a second refresh block both indicate the same block address, and when a second clock signal is applied, a busy signal is continually output until said refresh operation is completed for all word line addresses in said block.

43. The refresh control method for a dynamic semiconductor memory as claimed in claim 42, wherein the period of said second clock signal is not longer than data retention time of said dynamic semiconductor memory.

44. The refresh control method for a dynamic semiconductor memory as claimed in claim 32, wherein a refresh command is requested N times with a time equal to $tREF/2-tCY\times(M-1)\times N$, where M is the total number of refresh blocks, N is the total number of word lines in each block, tREF is the memory cell data retention time, and tCY is the period of a first clock.

45. The refresh control method for a dynamic semiconductor memory as claimed in claim 44, wherein a busy signal is output automatically and periodically with a period not longer than $(tREF/2-tCY\times(M-1)\times N)/N$.

* * * * *